(12) United States Patent
Shiomi et al.

(10) Patent No.: US 7,776,452 B2
(45) Date of Patent: Aug. 17, 2010

(54) HEAT SINK MEMBER AND METHOD OF MANUFACTURING THE SAME

(75) Inventors: Kazuhiro Shiomi, Suita (JP); Masaaki Ishio, Suita (JP); Tsuyoshi Hasegawa, Minamikawachi-gun (JP)

(73) Assignee: Neomax Materials Co. Ltd., Suita-shi (JP)

( * ) Notice: Subject to any disclaimer, the term of this patent is extended or adjusted under 35 U.S.C. 154(b) by 1233 days.

(21) Appl. No.: 10/566,721

(22) PCT Filed: Jul. 27, 2005

(86) PCT No.: PCT/JP2005/013705
§ 371 (c)(1),
(2), (4) Date: Feb. 2, 2006

(87) PCT Pub. No.: WO2006/016479

PCT Pub. Date: Feb. 16, 2006

(65) Prior Publication Data
US 2006/0244125 A1 Nov. 2, 2006

(30) Foreign Application Priority Data
Aug. 10, 2004 (JP) .................... 2004-233777

(51) Int. Cl.
*H01L 23/373* (2006.01)
*B32B 15/20* (2006.01)
(52) U.S. Cl. .............. 428/663; 428/674; 257/712; 228/262.61
(58) Field of Classification Search .............. None
See application file for complete search history.

(56) References Cited

U.S. PATENT DOCUMENTS

| 3,761,256 A * | 9/1973 | Strom ........................ 419/8 |
| 6,326,685 B1 * | 12/2001 | Jin et al. ................... 257/706 |
| 2001/0008703 A1* | 7/2001 | Sakata et al. ............... 428/546 |
| 2006/0061974 A1* | 3/2006 | Soga et al. ................. 361/743 |

FOREIGN PATENT DOCUMENTS

| GB | 2 138 633 A | 10/1984 |
| JP | 49-63382 | 6/1974 |

(Continued)

OTHER PUBLICATIONS

Japanese Office Action dated May 19, 2009, issued in corresponding Japanese Application No. 2006-531412.

(Continued)

*Primary Examiner*—Jennifer C McNeil
*Assistant Examiner*—Adam C Krupicka
(74) *Attorney, Agent, or Firm*—Westerman, Hattori, Daniels & Adrian, LLP (57) ABSTRACT

A heat sink member capable of suppressing development of cracks and chaps in manufacturing, suppressing enlargement of a thermal expansion coefficient and suppressing lowering of thermal conductivity is obtained. This heat sink member comprises a ply member (1) mainly composed of Cu, a substrate (2) mainly composed of Mo and a brazing layer (4) consisting of an Sn—Cu alloy (Sn: 1 mass % to 13 mass %) arranged between the ply member and the substrate for bonding the ply member and the substrate to each other.

16 Claims, 4 Drawing Sheets

FOREIGN PATENT DOCUMENTS

| | | |
|---|---|---|
| JP | 59-193036 | 11/1984 |
| JP | 61-42475 | 2/1986 |
| JP | 2-852 | 1/1990 |
| JP | 2-281642 | 11/1990 |
| JP | 5-226527 | 9/1993 |
| JP | 11-284111 | 10/1999 |
| JP | 11284111 A * | 10/1999 |
| WO | WO 02/49797 * | 6/2002 |

OTHER PUBLICATIONS

International Search Report dated Jul. 22, 2005 of International Application No. PCT/JP2005/013705.

* cited by examiner

HEAT SINK MEMBER AND METHOD OF MANUFACTURING THE SAME

TECHNICAL FIELD

The present invention relates to a heat sink member and a method of manufacturing the same, and more particularly, it relates to a heat sink member employing Mo (molybdenum) and a method of manufacturing the same.

BACKGROUND ART

In general, a heat sink member employing molybdenum (Mo) is known as a heat sink member for absorbing heat generated from an electronic component or the like and radiating the same outward. A Cu/Mo/Cu clad member prepared by employing molybdenum as a substrate and cladding the same with Cu as ply members is known as this heat sink member employing molybdenum. In general, this Cu/Mo/Cu clad member is manufactured by hot pressure welding or cold pressure welding (cold rolling). However, Mo as the substrate is so hard and small in elongation that the same is easily cracked or chapped in the hot pressure welding or the cold pressure welding (cold rolling). Particularly in the method cold-pressure-welding (cold-rolling) the Cu/Mo/Cu clad member, there is such inconvenience that the substrate consisting of Mo is easily cracked or chapped when rolling the substrate consisting of Mo and the ply members consisting of Cu and bonding the same to each other.

In general, therefore, a heat sink member inhibiting a substrate consisting of Mo (molybdenum) from development of cracks and chaps by bonding the substrate consisting of Mo and ply members consisting of Cu to each other with brazing filler metal in place of the hot pressure welding or the cold pressure welding (cold rolling) is proposed. Such a heat sink member is disclosed in Japanese Patent Laying-Open No. 11-284111, for example.

A heat sink member consisting of a Cu/Mo/Cu clad member prepared by bonding ply members consisting of plates of copper (Cu) and a substrate consisting of a plate of molybdenum (Mo) to each other with brazing filler metal consisting of an Mn—Ni—Cu alloy is disclosed in the aforementioned Japanese Patent Laying-Open No. 11-284111. In this bonding method employing the brazing filler metal consisting of the Mn—Ni—Cu alloy disclosed in Japanese Patent Laying-Open No. 11-28411, the substrate consisting of the plate of Mo (molybdenum) is not pressure-welded in manufacturing of the heat sink member consisting of the Cu/Mo/Cu clad member, whereby it is possible to inhibit the substrate consisting of the plate of molybdenum from development of cracks and chaps.

In the method bonding the substrate consisting of Mo and the ply members consisting of Cu to each other with the brazing filler metal consisting of the Mn—Ni—Cu alloy disclosed in the aforementioned Japanese Patent Laying-Open No. 11-28411, however, there is such inconvenience that the thermal expansion coefficient of the Cu/Mo/Cu clad member enlarges due to the brazing filler metal. When arranging a semiconductor element consisting of silicon or the like having a small thermal expansion coefficient on the heat sink member consisting of the Cu/Mo/Cu clad member, therefore, thermal expansion coefficient difference between the heat sink member and the semiconductor element enlarges. Consequently, there is such a problem that cracks or chaps easily develop on the junction between the semiconductor element and the heat sink member consisting of the Cu/Mo/Cu clad member. When employing the brazing filler metal consisting of the Mn—Ni—Cu alloy as in the aforementioned Japanese Patent Laying-Open No. 11-284111, there is also such inconvenience that thermal conductivity of the heat sink member consisting of the Cu/Mo/Cu clad member remarkably lowers. Thus, there is also such a problem that heat radiability of the heat sink member remarkably lowers.

DISCLOSURE OF THE INVENTION

The present invention has been proposed in order to solve the aforementioned problems, and an object of the present invention is to provide a heat sink member capable of suppressing development of cracks and chaps in manufacturing, suppressing enlargement of a thermal expansion coefficient and suppressing lowering of thermal conductivity and a method of manufacturing the same.

In order to attain the aforementioned object, a heat sink member according to a first aspect of the present invention comprises a first layer mainly composed of Cu, a second layer mainly composed of Mo and a first brazing layer consisting of an Sn—Cu alloy arranged between the first layer and one surface of the second layer for bonding the first layer and the second layer to each other.

In the heat sink member according to the first aspect of the present invention, as hereinabove described, the first brazing layer consisting of the Sn—Cu alloy arranged between the first layer mainly composed of Cu (copper) and one surface of the second layer mainly composed of Mo (molybdenum) for bonding the first layer and the second layer to each other is so provided that there is no need to pressure-weld the first layer and the second layer to each other when bonding the first layer mainly composed of Cu and the second layer mainly composed of Mo to each other, whereby the second layer mainly composed of Mo can be inhibited from development of cracks and chaps. Further, the first brazing layer consisting of the Sn—Cu alloy is so employed as a brazing layer for bonding the first layer mainly composed of Cu and the second layer mainly composed of Mo to each other that the thermal expansion coefficient of the heat sink member can be inhibited from enlargement as compared with a case of employing brazing filler metal consisting of an Mn—Ni—Cu alloy. Thus, it is possible to inhibit thermal expansion coefficient difference between the heat sink member and a semiconductor element from enlargement when arranging the semiconductor element consisting of silicon or the like having a small thermal expansion coefficient on the heat sink member, whereby the junction between the semiconductor element and the heat sink member can be inhibited from development of cracks and chaps under a high temperature. Further, the first brazing layer consisting of the Sn—Cu alloy is so employed that the thermal conductivity of the first brazing layer can be enlarged as compared with the case of employing the brazing filler metal consisting of the Mn—Ni—Cu alloy, whereby the thermal conductivity of the heat sink member can be inhibited from lowering.

In the aforementioned heat sink member according to the first aspect, the content of Sn in the first brazing layer is preferably at least 1 mass %. When employing the first brazing layer consisting of the Sn—Cu alloy containing at least 1 mass % of Sn in this manner, the melting point of the first brazing layer consisting of the Sn—Cu alloy can be rendered lower than those of the first layer mainly composed of Cu and the second layer mainly composed of Mo, whereby it is possible to melt only the first brazing layer consisting of the Sn—Cu alloy without melting the first layer and the second layer when performing brazing.

In the aforementioned heat sink member according to the first aspect, the content of Sn in the first brazing layer is preferably not more than 13 mass %. When employing the first brazing layer consisting of the Sn—Cu alloy containing not more than 13 mass % of Sn in this manner, the first brazing layer consisting of the Sn—Cu alloy can be inhibited from embrittlement, whereby it is possible to inhibit the first brazing layer from development of cracks and chaps when rolling the first brazing layer to a prescribed thickness.

In the aforementioned heat sink member according to the first aspect, the second layer mainly composed of Mo is preferably formed by sintering. Mo (molybdenum) formed by sintering in this manner is hard and small in elongation, whereby it is possible to easily suppress development of cracks and chaps of Mo when performing brazing by employing the first brazing layer consisting of the Sn—Cu alloy according to the present invention without pressure welding.

In the aforementioned heat sink member according to the first aspect, the first layer and the second layer preferably have thicknesses of at least 0.1 mm and not more than 3.0 mm. According to this structure, the thickness of the heat sink member can be inhibited from excessive enlargement.

The aforementioned heat sink member according to the first aspect preferably further comprises a third layer mainly composed of Cu and a second brazing layer consisting of an Sn—Cu alloy arranged between the other surface of the second layer and the third layer for bonding the second layer and the third layer to each other, and a semiconductor element is preferably arranged on the surface of the third layer. According to this structure, a heat sink member having large thermal conductivity formed by employing the second layer mainly composed of Mo as a substrate and arranging ply members (the first layer and the third layer) mainly composed of Cu on both sides thereof with the first and second brazing layers consisting of the Sn—Cu alloy can be obtained. Further, the third layer mainly composed of Cu is excellent in wettability with solder or epoxy resin, whereby the semiconductor element can be easily bonded onto the surface of the third layer with solder or epoxy resin. Thus, heat of the semiconductor element can be excellently radiated through the third layer, the second brazing layer, the second layer, the first brazing layer and the first layer.

In the aforementioned heat sink member comprising the third layer and the second brazing layer, the content of Sn in the second brazing layer is preferably at least 1 mass % and not more than 13 mass %. When employing the second brazing layer consisting of the Sn—Cu alloy containing at least 1 mass % of Sn in this manner, the melting point of the second brazing layer consisting of the Sn—Cu alloy can be rendered lower than those of the first layer and the second layer mainly composed of Cu and the second layer mainly composed of Mo, whereby it is possible to melt the second brazing layer consisting of the Sn—Cu alloy without melting the first layer, the second layer and the third layer when performing brazing. When employing the second brazing layer consisting of the Sn—Cu alloy containing not more than 13 mass % of Sn, further, the second brazing layer consisting of the Sn—Cu alloy can be inhibited from embrittlement, whereby it is possible to inhibit the second brazing layer from development of cracks and chaps when rolling the second brazing layer to a prescribed thickness.

In the aforementioned heat sink member comprising the third layer and the second brazing layer, the second layer is preferably arranged on a region of the surface of the first layer corresponding to a region where the semiconductor element is arranged. According to this structure, the second layer mainly composed of Mo can be arranged only on a region necessary as a heat sink, whereby the usage of high-priced Mo can be decreased.

In the aforementioned heat sink member comprising the third layer and the second brazing layer, the third layer preferably has a thickness of at least 0.1 mm and not more than 3.0 mm. According to this structure, the thickness of the heat sink member can be inhibited from excessive enlargement.

A method of manufacturing a heat sink member according to a second aspect of the present invention comprises steps of arranging a first brazing layer consisting of an Sn—Cu alloy between a first layer mainly composed of Cu and one surface of a second layer mainly composed of Mo and bonding the first layer and the second layer to each other by melting the first brazing layer.

In the method of manufacturing a heat sink member according to the second aspect of the present invention, as hereinabove described, the first brazing layer consisting of the Sn—Cu alloy is arranged between the first layer mainly composed of Cu (copper) and one surface of the second layer mainly composed of Mo (molybdenum) while the first layer and the second layer are bonded to each other by melting the first brazing layer so that there is no need to pressure-weld the first layer and the second layer to each other when bonding the first layer mainly composed of Cu and the second layer mainly composed of Mo to each other, whereby the second layer mainly composed of Mo can be inhibited from development of cracks and chaps. Further, the first brazing layer consisting of the Sn—Cu alloy is arranged between the first layer mainly composed of Cu and one surface of the second layer mainly composed of Mo while the first layer and the second layer are bonded to each other by melting the first brazing layer, whereby the thermal expansion coefficient of the heat sink member can be inhibited from enlargement as compared with a case of employing brazing filler metal consisting of an Mn—Ni—Cu alloy. Thus, thermal expansion coefficient difference between the heat sink member and a semiconductor element can be inhibited from enlargement when arranging the semiconductor element consisting of silicon or the like having a small thermal expansion coefficient on the heat sink member, whereby the junction between the semiconductor element and the heat sink member can be inhibited from development of crack and chaps under a high temperature. Further, the first brazing layer consisting of the Sn—Cu alloy is so employed that the thermal conductivity of the first brazing layer can be enlarged as compared with the case of employing the brazing filler metal consisting of the Mn—Ni—Cu alloy, whereby the thermal conductivity of the heat sink member can be inhibited from lowering.

In the aforementioned method of manufacturing a heat sink member according to the second aspect, the content of Sn in the first brazing layer is preferably at least 1 mass %. When employing the first brazing layer consisting of the Sn—Cu alloy containing at least 1 mass % of Sn in this manner, the melting point of the first brazing layer consisting of the Sn—Cu alloy can be rendered lower than those of the first layer mainly composed of Cu and the second layer mainly composed of Mo, whereby it is possible to melt only the first brazing layer consisting of the Sn—Cu alloy without melting the first layer and the second layer when performing brazing.

In the aforementioned method of manufacturing a heat sink member according to the second aspect, the content of Sn in the first brazing layer is preferably not more than 13 mass %. When employing the first brazing layer consisting of the Sn—Cu alloy containing not more than 13 mass % of Sn in this manner, the first brazing layer consisting of the Sn—Cu alloy can be inhibited from embrittlement, whereby it is possible to inhibit the first brazing layer from development of cracks and chaps when rolling the first brazing layer to a prescribed thickness.

The aforementioned method of manufacturing a heat sink member according to the second aspect preferably further comprises a step of forming the second layer mainly composed of Mo by sintering. Mo (molybdenum) formed by sintering in this manner is hard and small in elongation, whereby it is possible to easily suppress development of cracks and chaps of Mo when performing brazing by employing the first brazing layer consisting of the Sn—Cu alloy according to the present invention without pressure welding.

In the aforementioned method of manufacturing a heat sink member according to the second aspect, the first layer and the second layer preferably have thicknesses of at least 0.1 mm and not more than 3.0 mm. According to this structure, the thickness of the heat sink member can be inhibited from excessive enlargement.

The aforementioned method of manufacturing a heat sink member according to the second aspect preferably further comprises a step of previously bonding the first layer and the first brazing layer to each other in advance of the step of arranging the first brazing layer between the first layer and the second layer. According to this structure, the easily deformed first brazing layer can be previously bonded to the first layer, whereby the first brazing layer can be inhibited from deformation when arranging the first brazing layer between the first layer and the second layer. Thus, brazing can be smoothly performed.

In the aforementioned method of manufacturing a heat sink member according to the second aspect, the step of arranging the first brazing layer between the first layer and the second layer preferably includes a step of arranging the first brazing layer between the first layer and one surface of the second layer and arranging a second brazing layer consisting of an Sn—Cu alloy between the other surface of the second layer and a third layer mainly composed of Cu, and the step of bonding the first layer and the second layer to each other preferably includes a step of bonding the first layer and the second layer to each other and bonding the second layer and the third layer to each other by melting the first brazing layer and the second brazing layer. According to this structure, a heat sink member having large thermal conductivity formed by employing the second layer mainly composed of Mo as a substrate and arranging ply members (the first layer and the third layer) mainly composed of Cu on both sides thereof with the first and second brazing layers of the Sn—Cu alloy can be. Further, the third layer mainly composed of Cu is excellent in wettability with solder or epoxy resin, whereby the semiconductor element can be easily bonded onto the surface of the third layer with solder or epoxy resin. According to these, heat of the semiconductor element can be excellently radiated through the third layer, the second brazing layer, the second layer, the first brazing layer and the first layer. In addition, the step of bonding the first layer and the second layer to each other includes the step of bonding the first layer and the second layer to each other and bonding the second layer and the third layer to each other by melting the first brazing layer and the second brazing layer, whereby one surface and the other surface of the second layer can be bonded to the first layer and the third layer respectively in one step.

In the aforementioned method of manufacturing a heat sink member in which the step of arranging the first brazing layer between the first layer and the second layer includes the step of arranging the second brazing layer between the second layer and the third layer, the content of Sn in the second brazing layer is preferably at least 1 mass % and not more than 13 mass %. When employing the second brazing layer consisting of the Sn—Cu alloy containing at least 1 mass % of Sn in this manner, the melting point of the second brazing layer consisting of the Sn—Cu alloy can be rendered lower than those of the first layer and the third layer mainly composed of Cu and the second layer mainly composed of Mo, whereby it is possible to melt the second brazing layer consisting of the Sn—Cu alloy without melting the first layer, the second layer and the third layer when performing brazing. When employing the second brazing layer consisting of the Sn—Cu alloy containing not more than 13 mass % of Sn, further, the second brazing layer consisting of the Sn—Cu alloy can be inhibited from embrittlement, whereby it is possible to inhibit the second brazing layer from development of cracks and chaps when rolling the second brazing layer to a prescribed thickness.

In the aforementioned method of manufacturing a heat sink member in which the step of arranging the first brazing layer between the first layer and the second layer includes the step of arranging the second brazing layer between the second layer and the third layer, a semiconductor element is preferably arranged on the surface of the third layer, and the method preferably further comprises a step of preparing the second layer arranged on a region of the surface of the first layer corresponding to a region where the semiconductor element is arranged in advance of the step of arranging the first brazing layer between the first layer and the second layer. According to this structure, the second layer mainly composed of Mo can be arranged only on a region necessary as a heat sink, whereby the usage of high-priced Mo can be decreased.

In the aforementioned method of manufacturing a heat sink member in which the step of arranging the first brazing layer between the first layer and the second layer includes the step of arranging the second brazing layer between the second layer and the third layer, the third layer preferably has a thickness of at least 0.1 mm and not more than 3.0 mm. According to this structure, the thickness of the heat sink member can be inhibited from excessive enlargement.

BEST MODE FOR CARRYING OUT THE INVENTION

Embodiments of the present invention are now described with reference to the drawings.

First Embodiment

Figure 1:
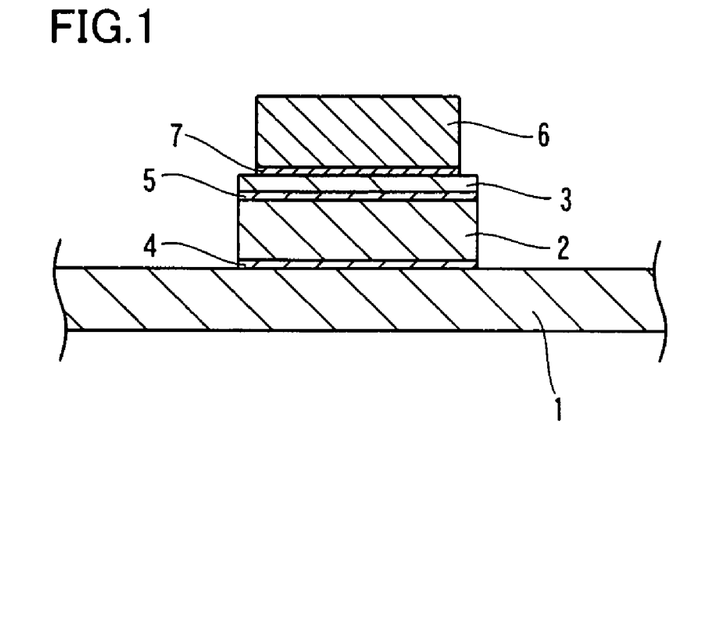
[FIG. 1] A sectional view showing a state of mounting a semiconductor element on a heat sink member according to a first embodiment of the present invention.
Figure 2:
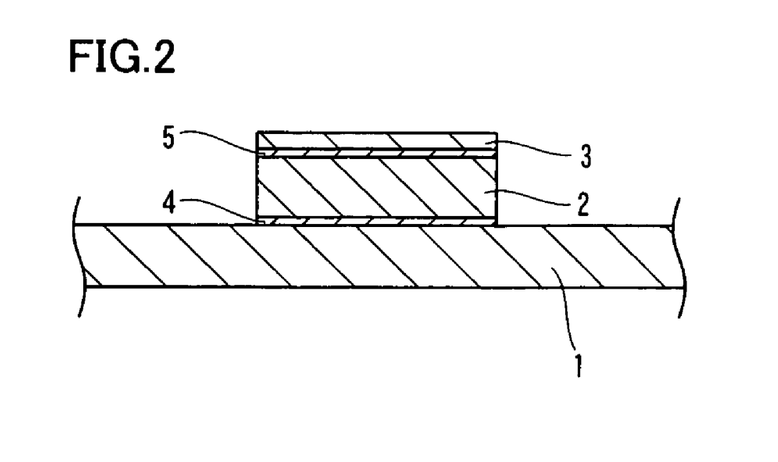
[FIG. 2] A sectional view showing the heat sink member according to the first embodiment of the present invention.

FIG. 1 is a sectional view showing a state of mounting a semiconductor element on a heat sink member according to a first embodiment of the present invention. FIG. 2 is a sectional view showing the heat sink member according to the first embodiment of the present invention. First, the structure of the heat sink member according to the first embodiment of the present invention is described with reference to FIGS. 1 and 2.

The heat sink member according to the first embodiment of the present invention includes a ply member 1 mainly composed of Cu (copper), a substrate 2 mainly composed of Mo (molybdenum) and another ply member 3 mainly composed of Cu (copper), as shown in FIG. 2. The ply member 1 and the ply member 3 are examples of the "first layer" and the "third layer" in the present invention respectively, and the substrate 2 is an example of the "second layer" in the present invention. The ply member 1, the substrate 2 and the ply member 3 have thicknesses of about 0.1 mm to about 3.0 mm. The substrate 2 and the ply member 3 are formed on part of the surface of the ply member 1.

According to the first embodiment, the ply member 1 mainly composed of Cu and the substrate 2 mainly composed of Mo are bonded to each other through a brazing layer 4 consisting of an Sn—Cu alloy (Sn: 1 mass % to 13 mass %). This brazing layer 4 is an example of the "first brazing layer" in the present invention. Further, the substrate 2 mainly composed of Mo and the ply member 3 mainly composed of Cu are bonded to each other through another brazing layer 5 consisting of an Sn—Cu alloy (Sn: 1 mass % to 13 mass %). This brazing layer 5 is an example of the "second brazing layer" in the present invention. Both of the brazing layers 4 and 5 consisting of the Sn—Cu alloy have thicknesses of about 0.01 mm to about 0.07 mm. A semiconductor element 6 is fixed onto the upper surface of the ply member 3 mainly composed of Cu through a bonding layer 7 consisting of solder or epoxy resin, as shown in FIG. 1.

Figure 3:
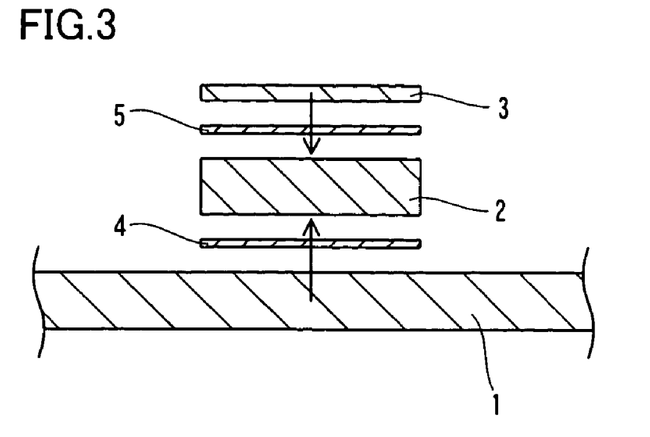
[FIG. 3] A sectional view for illustrating a method of manufacturing the heat sink member according to the first embodiment of the present invention.

FIG. 3 is a sectional view for illustrating a method of manufacturing the heat sink member according to the first embodiment of the present invention. The method of manufacturing the heat sink member according to the first embodiment of the present invention is now described with reference to FIG. 3.

First, a member mainly composed of Mo (molybdenum) is formed by sintering to have a thickness of about 0.1 mm to about 3.0 mm. The substrate 2 is formed by cutting this member so that the length thereof is smaller than that of the ply member 1. Thus, the member mainly composed of Mo can be employed by a quantity necessary as a heat sink, whereby it is possible to reduce the usage of high-priced Mo. The ply members 1 and 3 are formed by rolling a member mainly composed of Cu into a thickness of about 0.1 mm to about 3.0 mm and thereafter cutting the same into prescribed sizes. At this time, the ply member 3 is formed so that the length thereof is substantially identical to the length of the substrate 2.

The brazing layers 4 and 5 are formed by hot-rolling a member consisting of an Sn—Cu alloy (Sn: 1 mass % to 13 mass %) at a temperature of about 650° C. to about 750° C. thereby forming the same to a thickness of about 0.1 mm to about 3.0 mm and thereafter cutting this member into lengths substantially identical to those of the substrate 2 and the ply member 3.

Then, according to the first embodiment of the present invention, the brazing layer 4, the substrate 2, the brazing layer 5 and the ply member 3 are superposed on the upper surface of the ply member 1 in this order, and thereafter pressed with a draft of about $9.8 \times 10^2$ Pa to about $9.8 \times 10^4$ Pa. The ply member 1 and the substrate 2 are boned to each other and the substrate 2 and the ply member 3 are bonded to each other by heating the same in this pressed state in a hydrogen atmosphere at a temperature of about 810° C. to about 1030° C. for about 1 minute to about 30 minutes thereby melting the brazing layers 4 and 5. Thus, the heat sink member according to the first embodiment shown in FIG. 2 is formed.

According to the first embodiment, as hereinabove described, the brazing layer 4 consisting of the Sn—Cu alloy (Sn: 1 mass % to 13 mass %) for bonding the ply member 1 mainly composed of Cu (copper) and the lower surface of the substrate 2 mainly composed of Mo (molybdenum) to each other and the brazing layer 5 consisting of the Sn—Cu alloy (Sn: 1 mass % to 13 mass %) for bonding the ply member 3 mainly composed of Cu and the upper surface of the substrate 2 mainly composed of Mo to each other are so provided that there is no need to pressure-weld the ply member 1, the substrate 2 and the ply member 3 to each other when bonding the ply member 1 mainly composed of Cu and the substrate 2 mainly composed of Mo to each other and bonding the lower surface of the substrate 2 mainly composed of Mo and the ply member 3 mainly composed of Cu to each other, whereby the substrate 2 mainly composed of Mo can be inhibited from development of cracks and chaps. Further, the brazing layers 4 and 5 consisting of the Sn—Cu alloy (Sn: 1 mass % to 13 mass %) are so provided that the thermal expansion coefficient of the heat sink member can be inhibited from enlargement as compared with a case of employing brazing filler metal consisting of an Mn—Ni—Cu alloy. Thus, thermal expansion coefficient difference between the heat sink member and the semiconductor element 6 can be inhibited from enlargement when arranging the semiconductor element 6 consisting of silicon or the like having a small thermal expansion coefficient, whereby the junction between the semiconductor element 6 and the heat sink member can be inhibited from development of cracks and chaps under a high temperature. Further, the brazing layers 4 and 5 consisting of the Sn—Cu alloy (Sn: 1 mass % to 13 mass %) are so employed that the thermal conductivity of the brazing layers 4 and 5 can be enlarged as compared with the case of employing the brazing filler metal consisting of the Mn—Ni—Cu alloy, whereby the thermal conductivity of the heat sink member can be inhibited from lowering.

According to the first embodiment, as hereinabove described, the brazing layers 4 and 5 consisting of the Sn—Cu alloy containing at least 1 mass % of Sn are so employed that the melting points of the brazing layers 4 and 5 consisting of the Sn—Cu alloy can be rendered lower than those of the ply members 1 and 3 mainly composed of Cu and the substrate 2 mainly composed of Mo, whereby it is possible to melt only the brazing layers 4 and 5 consisting of the Sn—Cu alloy without melting the ply members 1 and 3 and the substrate 2 when performing brazing.

According to the first embodiment, as hereinabove described, the Sn—Cu alloy containing not more than 13 mass % of Sn is so employed for the brazing layers 4 and 5 that the brazing layers 4 and 5 consisting of the Sn—Cu alloy can be inhibited from embrittlement, whereby it is possible to inhibit the brazing layers 4 and 5 from development of cracks and chaps when rolling the brazing layers 4 and 5 into the thicknesses of about 0.1 mm to about 3.0 mm.

According to the first embodiment, as hereinabove described, the brazing layers 4 and 5 consisting of the Sn—Cu alloy are employed for performing brazing without pressure welding, whereby development of cracks and chaps of Mo can be easily suppressed also when employing the substrate 2 of Mo, hard and small in elongation, formed by sintering.

According to the first embodiment, as hereinabove described, the semiconductor element 6 is so arranged on the surface of the ply member 3 mainly composed of Cu that the semiconductor element 6 can be easily bonded onto the surface of the ply member 3 with solder or epoxy resin since the ply member 3 mainly composed of Cu is excellent in wettability with solder or epoxy resin. Thus, heat of the semiconductor element 6 can be excellently radiated through the ply member 3, the brazing layer 5, the substrate 2, the brazing layer 4 and the ply member 1. Further, one surface and the other surface of the substrate 2 can be bonded to the ply members 1 and 3 respectively in one step by performing the operations of bonding the ply member 1 and the substrate 2 to each other and bonding the substrate 2 and the ply member 3 to each other by melting the brazing layers 4 and 5 in the same step.

Experiments performed for confirming the effects of the heat sink member according to the aforementioned first embodiment are now described. First, a comparative experiment on workability (hot rolling) of Sn—Cu alloys is described. In this comparative experiment, samples according to Examples 1 to 7 corresponding to the first embodiment were prepared while a sample according to comparative example 1 was prepared.

In Examples 1 to 7, triplets of samples were prepared by cutting Sn—Cu alloys having Sn contents of 1 mass %, 2 mass %, 2.75 mass %, 5.21 mass %, 7 mass %, 10 mass % and 13 mass % respectively into about 10 mm squares with lengths of about 50 mm respectively. In comparative example, three samples were prepared by cutting an Sn—Cu alloy having an Sn content of 14 mass % into about 10 mm squares with lengths of about 50 mm. The respective triplets of samples according to Examples 1 to 7 and comparative example 1 prepared in the aforementioned manners were rolled under temperature conditions of 650° C., 700° C. and 750° C. respectively, for confirming presence/absence of cracks and chaps. Table 1 shows the results.

TABLE 1

|  | Temperature | | |
| --- | --- | --- | --- |
|  | 650° C. | 700° C. | 750° C. |
| 1Sn—Cu (Example 1) | o | o | o |
| 2Sn—Cu (Example 2) | o | o | o |
| 2.75Sn—Cu (Example 3) | o | o | o |
| 5.21Sn—Cu (Example 4) | o | o | o |
| 7Sn—Cu (Example 5) | o | o | o |
| 10Sn—Cu (Example 6) | o | o | o |
| 13Sn—Cu (Example 7) | o | o | o |
| 14Sn—Cu (Comparative Example 1) | x | x | x | o: neither cracked nor chapped
x: cracked and chapped

Referring to the above Table 1, it has been proved that the Sn—Cu alloys were hardly cracked or chapped in roll working in the Sn—Cu alloys according to Examples 1 to 7 having the Sn contents of 1 mass % to 13 mass %. On the other hand, it has been proved that the Sn—Cu alloy was easily cracked or chapped in roll working in the Sn—Cu alloy according to comparative example 1 having the Sn content of 14 mass %. This is conceivably because the Sn—Cu alloy embrittles as the content of Sn increases. From these results, it is conceivably preferable the content of Sn is at least 1 mass % and not more than 13 mass % in order to prevent development of cracks and chaps in roll working of brazing filler metal consisting of an Sn—Cu alloy. O in Table 1 shows that no cracks and chaps developed, and X shows that cracks and chaps developed.

Results obtained by measuring melting points with a DTA (differential thermal analysis) apparatus (DTA8121 by RIGAKU) as to the samples according to Examples 1 to 7 and comparative example 1 prepared in the aforementioned manners are now described. The following Table 2 shows the measured melting points.

TABLE 2

|  | Melting Point |
| --- | --- |
| 1Sn—Cu (Example 1) | 1000° C. |
| 2Sn—Cu (Example 2) | 970° C. |
| 2.75Sn—Cu (Example 3) | 950° C. |
| 5.21Sn—Cu (Example 4) | 935° C. |
| 7Sn—Cu (Example 5) | 890° C. |
| 10Sn—Cu (Example 6) | 850° C. |
| 13Sn—Cu (Example 7) | 810° C. |
| 14Sn—Cu (Comparative Example 1) | 800° C. |

Referring to the above Table 2, it has been proved that the melting point (about 1000° C.) of the Sn—Cu alloy (Sn: 1 mass %) according to Example 1 is the highest among the Sn—Cu alloys according to Examples 1 to 7 and comparative example 1 having the Sn contents of 1 mass % to 14 mass %. However, this melting point (1000° C.) of Example 1 is sufficiently low with respect to the melting point (1083° C.) of Cu. From this result, it is conceivably possible to melt only the Sn—Cu alloys without melting ply members mainly composed of Cu in a case of performing brazing with the Sn—Cu alloys according to Examples 1 to 7 and comparative example 1 having the Sn contents of 1 mass % to 14 mass %.

Results obtained by preparing samples (heat sink members) according to Examples 8 to 13 corresponding to the aforementioned first embodiment and comparative example 2 corresponding to the prior art and measuring thermal expansion coefficients are now described. More specifically, members having thicknesses of about 2 mm were prepared by bonding ply members 1, substrates 2 and ply members 3 having thicknesses of about 0.63 mm respectively to each other through brazing layers 4 and 5 of Sn—Cu alloys (Sn: 2 mass % to 13 mass %) having thicknesses of about 0.05 mm respectively in Examples 8 to 13. Samples were prepared by cutting these members into about 2 mm squares with lengths of about 50 mm, and the thermal expansion coefficients were measured. In Examples 8 to 13, the contents of Sn in the brazing layers 4 and 5 were set to 2 mass %, 2.75 mass %, 5.21 mass %, 7 mass %, 10 mass % and 13 mass % respectively. In comparative example 2, the sample was prepared by employing a 15.2Mn-10.1Ni—Cu alloy as brazing layers by a method with remaining conditions similar to those of the aforementioned Examples 8 to 13, and the thermal expansion coefficient was measured. The following Table 3 shows the results.

TABLE 3

| | Thermal Expansion Coefficient ($\times 10^{-6}$/K) |
|---|---|
| 2Sn—Cu (Example 8) | 8.2 |
| 2.75Sn—Cu (Example 9) | 8.2 |
| 5.21 Sn—Cu (Example 10) | 8.3 |
| 7Sn—Cu (Example 11) | 8.4 |
| 10Sn—Cu (Example 12) | 8.5 |
| 13Sn—Cu (Example 13) | 8.6 |
| 15.2Mn—10.1Ni—Cu (Comparative Example 2) | 10.4 |

Referring to the above Table 3, it has been proved that the thermal expansion coefficients ($8.2 \times 10^{-6}$/K to $8.6 \times 10^{-6}$/K) of the heat sink members according to Examples 8 to 13 employing the Sn—Cu alloys having the Sn contents of 2 mass % to 13 mass % for the brazing layers 4 and 5 are smaller than the thermal expansion coefficient ($10.4 \times 10^{-6}$/K) of the heat sink member according to comparative example 2 employing the 15.2Mn-10.1Ni—Cu alloy for the brazing layers. Further, it has been proved that there is a tendency that the thermal expansion coefficients of the heat sink members also decrease as the Sn contents in the brazing layers 4 and 5 decrease. From these results, it is conceivable that the thermal expansion coefficient of a heat sink member is smaller than the thermal expansion coefficient of the heat sink member according to comparative example 2 employing the 15.2Mn-10.1Ni—Cu alloy for the brazing layers also in a case where the Sn contents in the brazing layers 4 and 5 are 1 mass %.

Results obtained by preparing samples (heat sink members) according to Examples 14 to 19 corresponding to the aforementioned first embodiment and comparative example 3 corresponding to the prior art and measuring thermal conductivity are now described. More specifically, members having thicknesses of about 1 mm were prepared by bonding ply members 1, substrates 2 and ply members 3 having thicknesses of 0.3 mm respectively to each other through brazing layers 4 and 5 of Sn—Cu alloys (Sn: 2 mass % to 13 mass %) having thicknesses of about 0.05 mm respectively in Examples 14 to 19. Samples were prepared by cutting these members into cylindrical forms having diameters of about 10 mm and thicknesses of about 1 mm. In Examples 14 to 19, the Sn contents in the brazing layers 4 and 5 were set to 2 mass %, 2.75 mass %, 5.21 mass %, 7 mass %, 10 mass % and 13 mass % respectively. In comparative example 3, the sample was prepared by employing a 15.2Mn-10.1Ni—Cu alloy as brazing layers by a method with remaining conditions similar to those of the aforementioned Examples 14 to 19. Thermal conductivity values of the samples according to Examples 14 to 19 and comparative example 3 prepared in the aforementioned manners were measured by a thermal conductivity measuring apparatus (TC7000 by Ulvac Riko) employing a laser flash method. The following Table 4 shows the results.

TABLE 4

| | Thermal Conductivity (W/(m · K)) |
|---|---|
| 2Sn—Cu (Example 14) | 248 |
| 2.75Sn—Cu (Example 15) | 248 |
| 5.21Sn—Cu (Example 16) | 232 |
| 7Sn—Cu (Example 17) | 230 |
| 10Sn—Cu (Example 18) | 225 |
| 13Sn—Cu (Example 19) | 223 |
| 15.2Mn—10.1Ni—Cu (Comparative Example 3) | 206 |

Referring to the above Table 4, it has been proved that the thermal conductivity values (248 W/(m·K) to 223 W/(m·K)) of the heat sink members according to Examples 14 to 19 employing the Sn—Cu alloys having the Sn contents of 2 mass % to 13 mass % for the brazing layers 4 and 5 are larger than the thermal conductivity (206 W/(m·K)) of the heat sink member according to comparative example 3 employing the 15.2Mn-10.1Ni—Cu alloy for the brazing layers. Further, a tendency that the thermal conductivity values of the heat sink members increase as the Sn contents in the brazing layers 4 and 5 decrease has been proved. From these results, it is conceivable that the thermal expansion coefficient of a heat sink member is larger than the thermal conductivity of the heat sink member according to comparative example 3 employing the 15.2Mn-10.1Ni—Cu alloy for the brazing layers also in a case where the Sn contents in brazing layers 4 and 5 are 1 mass %.

Second Embodiment

Figure 4:
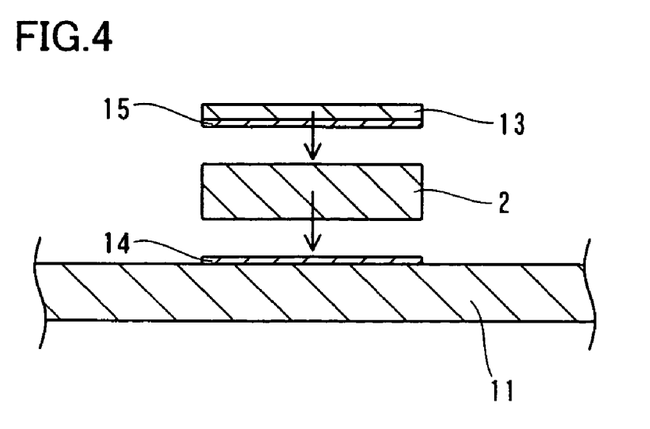
[FIG. 4] A sectional view for illustrating a method of manufacturing a heat sink member according to a second embodiment of the present invention.
Figure 5:
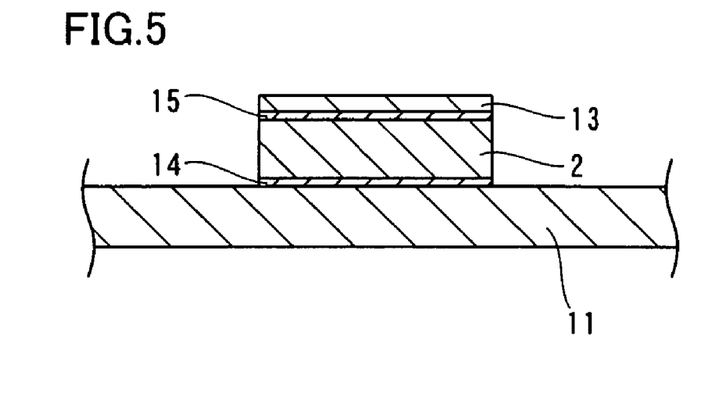
[FIG. 5] A sectional view for illustrating the method of manufacturing a heat sink member according to the second embodiment of the present invention.
Figure 6:
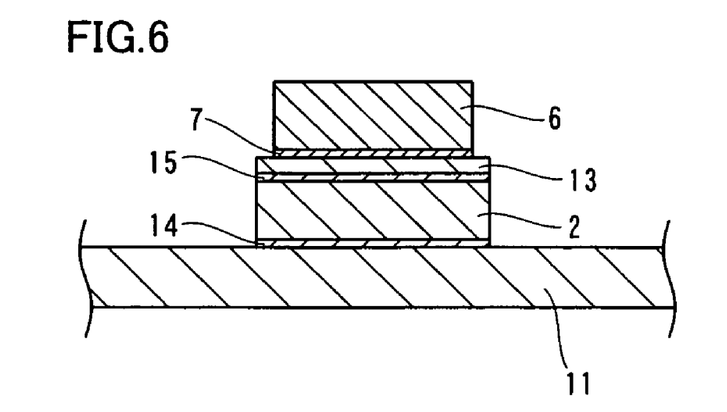
[FIG. 6] A sectional view for illustrating the method of manufacturing a heat sink member according to the second embodiment of the present invention.

FIGS. 4 to 6 are sectional views for illustrating a method of manufacturing a heat sink member according to a second embodiment of the present invention. In this second embodiment, a method of manufacturing a heat sink member different from the aforementioned first embodiment is described.

In the method of manufacturing a heat sink member according to this second embodiment, ply members 11 and 13 shown in FIG. 4 are first formed by rolling a member mainly composed of Cu into a thickness of about 0.25 mm to about 7.5 mm and cutting the same into prescribed sizes. At this time, the ply member 13 is formed so that the length thereof is smaller than that of the ply member 11. Further, a member mainly composed of Mo (molybdenum) is formed to have a thickness of about 0.1 mm to about 3.0 mm by sintering. A substrate 2 is formed by cutting this member into a length substantially identical to that of the ply member 13.

Further, brazing layers 14 and 15 are formed by forming a member consisting of an Sn—Cu alloy (Sn: 1 mass % to 13 mass %) into a thickness of about 0.025 mm to about 0.125 mm by hot-rolling the same at a temperature of about 650° C. to about 750° C. and thereafter cutting this member into lengths substantially identical to those of the substrate 2 and the ply member 13.

According to the second embodiment of the present invention, the ply member 11 and the brazing layer 14 are then pressure-welded to each other with a draft of about 60%, and the ply member 13 and the brazing layer 15 are pressure-welded to each other with a draft of about 60%, as shown in FIG. 4. Thereafter diffusion annealing is performed on the ply member 11 and the brazing layer 14 as well as the ply member 13 and the brazing layer 15 pressure-welded to each other in a hydrogen atmosphere at a temperature of about 700° C. to about 800° C. for 1 minute to 3 minutes. Thus, the easily deformed brazing layers 14 and 15 can be previously bonded to the ply members 11 and 13 before performing brazing, whereby the brazing layers 14 and 15 can be inhibited from deformation in brazing. Thus, brazing can be smoothly performed. Thereafter the substrate 2 and the ply member 13 to which the brazing layer 15 is pressure-welded are superposed on the upper surface of the brazing layer 14 pressure-welded to the ply member 11 in this order, and thereafter pressed with a draft of about $9.8 \times 10^2$ Pa to about $9.8 \times 10^4$ Pa. The ply member 11 and the substrate 2 are boned to each other and the substrate 2 and the ply member 13 are bonded to each other by heating the same in this pressed state in a hydrogen atmosphere at a temperature of about 900° C. to about 1030° C. for about 1 minute to about 30 minutes thereby melting the brazing layers 14 and 15. Thus, the heat sink member according to the second embodiment shown in FIG. 5 is formed. When employing the heat sink member according to the second embodiment formed in this manner as a heat sink for a semiconductor element 6, the semiconductor element 6 is mounted on the upper surface of the ply member 13 through a bonding layer 7 consisting of solder or epoxy resin, as shown in FIG. 6.

Also in the second embodiment, the brazing layer 14 and 15 consisting of the Sn—Cu alloy (Sn: 1 mass % to 13 mass %) for bonding the ply members 11 and 13 and the substrate 2 to each other are so provided that there is no need to pressure-weld the ply member 11, the substrate 2 and the ply member 13 to each other when bonding the ply members 11 and 13 mainly composed of Cu and the substrate 2 mainly composed of Mo to each other, whereby the substrate 2 mainly composed of Mo can be inhibited from development of cracks and chaps. Further, the brazing layers 14 and 15 consisting of the Sn—Cu alloy (Sn: 1 mass % to 13 mass %) are so provided that the thermal expansion coefficient of the heat sink member can be inhibited from enlargement and thermal conductivity can be enlarged as compared with a case of employing brazing filler metal consisting of an Mn—Ni—Cu alloy. Thus, the junction between the semiconductor element 6 and the heat sink member can be inhibited from development of cracks and chaps resulting from enlargement of thermal expansion coefficient difference between the heat sink member and the semiconductor element 6, and the thermal conductivity of the heat sink member can be inhibited from lowering.

The remaining effects of the second embodiment are similar to those of the aforementioned first embodiment.

The embodiments disclosed this time must be considered as illustrative and not restrictive in all points. The range of the present invention is shown not by the above description of the embodiments but the scope of claim for patent, and all modifications in the meaning and range equivalent to the scope of claim for patent are included.

Figure 7:
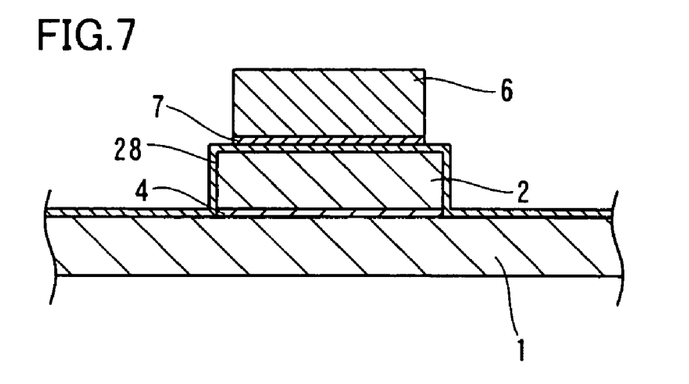
[FIG. 7] A sectional view showing a state of mounting a semiconductor element on a heat sink member according to a first modification of the first embodiment of the present invention.

For example, while the example of bonding the ply member 3 mainly composed of Cu onto the upper surface of the substrate 2 mainly composed of Mo (molybdenum) and mounting the semiconductor element 6 on the upper surface of the ply member 3 has been shown in the aforementioned first embodiment, the present invention is not restricted to this but a semiconductor element 6 may be mounted on the upper surface of a metal plating 28 by performing the metal plating 28 such as Ni plating or Au plating without arranging a ply member mainly composed of Cu on the upper surface of a substrate 2, as in a first modification shown in FIG. 7. Also in this structure, heat of the semiconductor element 6 can be radiated through a bonding layer 7, the metal plating 28, the substrate 2, a brazing layer 4 and a ply member 1, whereby the semiconductor element 6 can be inhibited from reaching a high temperature.

Figure 8:
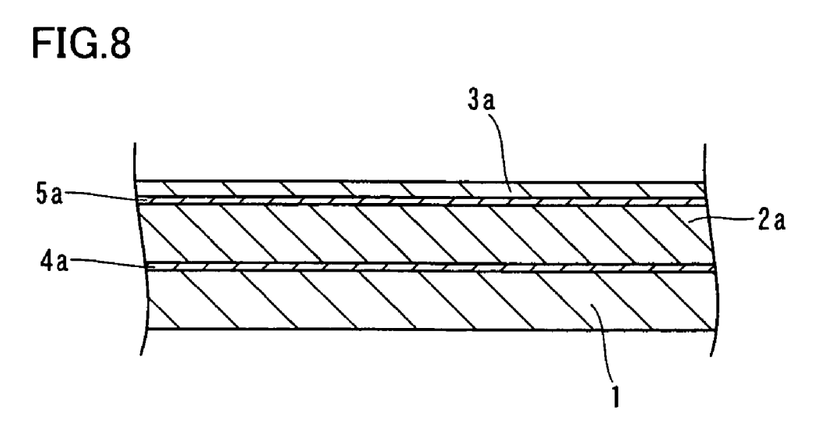
[FIG. 8] A sectional view for illustrating the structure of a heat sink member according to a second modification of the first embodiment of the present invention.

While the example of forming the substrate 2 and the ply member 3 so that the lengths thereof are smaller than that of the ply member 1 has been shown in the aforementioned first embodiment, the present invention is not restricted to this but a substrate 2a mainly composed of Mo and a ply member 3a mainly composed of Cu may be formed to have lengths identical to that of a ply member 1, as in a second modification shown in FIG. 8. In this case, brazing layers 4a and 5a consisting of an Sn—Cu alloy (Sn: 1 mass % to 13 mass %) may be formed in lengths identical to those of the ply member 1, the substrate 2a and the ply member 3a.

While the examples of employing the Sn—Cu alloys of only Sn and Cu as the brazing layers have been shown in the aforementioned embodiments, the present invention is not restricted to this but brazing layers consisting of an Sn—Cu alloy prepared by adding Pb, Fe, Zn, P or the like to an Sn—Cu alloy may be employed. In this case, the content of Pb, Fe, Zn, P or the like is preferably about 0.05 mass % to about 0.35 mass %.

While the examples of forming the brazing layers by hot-rolling the members consisting of the Sn—Cu alloys (Sn: 1 mass % to 13 mass %) have been shown in the aforementioned embodiments, the present invention is not restricted to this but the brazing layers may be formed by cold-rolling a member consisting of an Sn—Cu alloy (Sn: 1 mass % to 13 mass %).

The invention claimed is:

1. A heat sink member comprising:
   a first layer mainly composed of Cu;
   a second layer mainly composed of Mo, and
   a first brazing layer consisting of an Sn—Cu alloy arranged between said first layer and one surface of said second layer for bonding said first layer mainly composed of Cu and said second layer mainly composed of Mo to each other;
   the content of Sn in said first brazing layer is at least 1 mass % and not more than 13 mass %,
   the content of Cu is the highest of said first brazing layer, and the content of Sn is the second highest of said first brazing layer and
   said first brazing layer bonds said first layer mainly composed of Cu and said second layer mainly composed of Mo to each other.

2. The heat sink member according to claim 1, wherein said second layer mainly composed of Mo is formed by sintering.

3. The heat sink member according to claim 1, wherein said first layer and said second layer have thicknesses of at least 0.1 mm and not more than 3.0 mm.

4. The heat sink member according to claim 1, further comprising:
   a third layer mainly composed of Cu, and
   a second brazing layer consisting of an Sn—Cu alloy arranged between the other surface of said second layer and said third layer for bonding said second layer and said third layer to each other, wherein
   a semiconductor element is arranged on the surface of said third layer.

5. The heat sink member according to claim 4, wherein the content of Sn in said second brazing layer is at least 1 mass % and not more than 13 mass %.

6. The heat sink member according to claim 4, wherein said second layer is arranged on a region of the surface of said first layer corresponding to a region where said semiconductor element is arranged.

7. The heat sink member according to claim 4, wherein said third layer has a thickness of at least 0.1 mm and not more than 3.0 mm.

8. The heat sink member according to claim 1, wherein a semiconductor element is arranged on the side of the other surface of said second layer and
   said second layer is larger than a region where said semiconductor element is arranged and smaller than said first layer.

9. A method of manufacturing a heat sink member, comprising steps of:
   arranging a first brazing layer consisting of an Sn—Cu alloy between a first layer mainly composed of Cu and one surface of a second layer mainly composed of Mo; and
   bonding said first layer and said second layer to each other by melting said first brazing layer;

the content of Sn in said first brazing layer is at least 1 mass % and not more than 13 mass % and the content of Cu is the highest in said first brazing layer, and the content of Sn is the second highest in said first brazing layer.

10. The method of manufacturing a heat sink member according to claim 9, further comprising a step of forming said second layer mainly composed of Mo by sintering.

11. The method of manufacturing a heat sink member according to claim 9, wherein said first layer and said second layer have thicknesses of at least 0.1 mm and not more than 3.0 mm.

12. The method of manufacturing a heat sink member according to claim 9, further comprising a step of previously bonding said first layer and said first brazing layer to each other in advance of the step of arranging said first brazing layer between said first layer and said second layer.

13. The method of manufacturing a heat sink member according to claim 9, wherein the step of arranging said first brazing layer between said first layer and said second layer includes a step of arranging the first brazing layer between said first layer and one surface of said second layer and arranging a second brazing layer consisting of an Sn—Cu alloy between the other surface of said second layer and a third layer mainly composed of Cu, and the step of bonding said first layer and said second layer to each other includes a step of bonding said first layer and said second layer to each other and bonding said second layer and said third layer to each other by melting said first brazing layer and said second brazing layer.

14. The method of manufacturing a heat sink member according to 13, wherein the content of Sn in said second brazing layer is at least 1 mass % and not more than 13 mass %.

15. The method of manufacturing a heat sink member according to claim 13, wherein a semiconductor element is arranged on the surface of said third layer, the method further comprising a step of preparing said second layer arranged on a region of the surface of said first layer corresponding to a region where said semiconductor element is arranged in advance of the step of arranging said first brazing layer between said first layer and said second layer.

16. The method of manufacturing a heat sink member according to claim 13, wherein said third layer has a thickness of at least 0.1 mm and not more than 3.0 mm.

* * * * *